United States Patent [19]

Kogure et al.

[11] 4,356,425
[45] Oct. 26, 1982

[54] ELECTRODE FOR TUNING FORK TYPE QUARTZ CRYSTAL VIBRATOR

[75] Inventors: Shigeru Kogure; Eishi Momosaki; Minoru Inoue, all of Suwa, Japan

[73] Assignee: Kabushiki Kaisha Suwa Seikosha, Nagano, Japan

[21] Appl. No.: 122,870

[22] Filed: Feb. 20, 1980

[30] Foreign Application Priority Data

Feb. 20, 1979 [JP] Japan .................................. 54-18857

[51] Int. Cl.³ ............................................. H01L 41/08
[52] U.S. Cl. ..................................... 310/370; 310/366
[58] Field of Search .............................. 310/366, 370

[56] References Cited

U.S. PATENT DOCUMENTS

| 2,185,599 | 1/1940 | Mason | 310/370 X |
| 3,128,397 | 4/1964 | Shinada et al. | 310/361 |
| 4,173,726 | 11/1979 | Hanji | 310/366 |
| 4,191,906 | 3/1980 | Kogure | 310/370 |

FOREIGN PATENT DOCUMENTS

| 2913798 | 10/1979 | Fed. Rep. of Germany | 310/370 |
| 54-111297 | 8/1979 | Japan | 310/370 |

*Primary Examiner*—Mark O. Budd
*Attorney, Agent, or Firm*—Blum, Kaplan, Friedman, Silberman and Beran

[57] ABSTRACT

A tuning fork type quartz crystal vibrator has electrodes formed on its surfaces with the electrodes being divided into separated portions along the length of the tuning fork arms such that opposite electric fields and charges are juxtaposed in the same arm. Dividing the electrode at a location along the tuning fork arms where strains induced during vibration reverse direction, enhances the ability to induce vibrations. A low resonant resistance and high capacity ratio are provided for an overtone frequency of flexual vibrations.

12 Claims, 9 Drawing Figures

ELECTRODE FOR TUNING FORK TYPE QUARTZ CRYSTAL VIBRATOR

BACKGROUND OF THE INVENTION

This invention relates generally to a tuning fork type quartz crystal vibrator and more particularly to a tuning fork type quartz crystal vibrator where the electrodes formed on the arms are divided across the length of the arm. Also, this invention relates to a tuning fork type vibrator of the mode coupled type as described in detail in Japanese applications laid open under No. 23903/78 and No. 149500/78, which latter Japanese application corresponds in part to U.S. patent application Ser. No. 42,732, filed May 29, 1979, which is incorporated herein by reference. A mode coupled quartz tuning fork vibrator is characterized in that two different vibrational modes which occur in the tuning fork arms are coupled to each other with a result that the resonant frequency - temperature characteristic of a selected one of the two vibrational modes is improved. That is, there is little variation in the resonant frequency of the selected mode with reference to variations in ambient temperature.

Several modes of vibration are available when two vibrational modes are to be coupled in a tuning fork vibrator. A flexural vibration mode and a torsional vibration mode are utilized in the mode coupled quartz tuning fork vibrator in accordance with this invention. When these two vibrational modes are coupled to each other, the resonant frequency-temperature characteristic of the flexural vibration mode is improved and accordingly, when this vibrator is applied to an electronic timepiece, timekeeping accuracy can be greatly improved.

Either a fundamental vibration or an overtone of the flexural vibrational mode can be coupled to a torsional vibration mode. It is found to be more advantageous to use an overtone from the point of view of timekeeping accuracy rather than a fundamental frequency because the overtone of vibration has a higher Q value and a lower rate of change of the overtone resonant frequency due to aging than the rate of change of the fundamental vibration due to aging. Further, the resonant frequency of a tuning fork type vibrator may vary slightly depending on the attitude in mounting of the vibrator relative to the direction of gravity forces, and the variations of the overtone frequency are less than the variations of the fundamental frequency.

The overtone frequencies have two advantages as described above, but higher resonant frequencies do also have a disadvantage such that it is preferable that the lowest resonant overtone frequency, that is, the first overtone, is frequently used. The lowest overtone frequency is selected for the purpose of avoiding a large increase in power consumption associated with the use of higher frequencies when a mode coupled quartz tuning fork vibrator is applied to an electronic timepiece.

What is needed is a quartz tuning fork type crystal vibrator which is readily induced to vibrate at an overtone frequency and has good adjustability and low power consumption.

SUMMARY OF THE INVENTION

Generally speaking, in accordance with the invention, a tuning fork type quartz crystal vibrator having divided electrodes and being especially suitable for operating in the overtone mode of flexural vibration, is provided. The electrodes are divided into separated portions across the length of the tuning fork arms such that opposite electric fields and charges are juxtaposed in the same arm. Dividing the electrodes at a location along the tuning fork arms where strains induced during vibration reverse direction, enhances the ability to induce vibration of an overtone frequency. A low resonant resistance and high capacity ratio are provided for an overtone frequency of flexural vibration such that power consumption is low and adjustability of frequency can be provided over a substantially wide range. Charges induced in the arms by mechanical motion do not oppose the electrically induced fields.

Accordingly, it is an object of this invention to provide an improved tuning fork type quartz crystal vibrator having electrode patterns which enhance overtone modes of flexural vibration.

Another object of this invention is to provide improved tuning fork type quartz crystal vibrator which has a high capacity ratio and a low resonant resistance for an overtone mode of flexural vibration.

A further object of this invention is to provide an improved tuning fork type quartz crystal vibrator having electrodes of opposite polarity juxtaposed across the length of the tuning fork arms.

Still another object of this invention is to provide an improved tuning fork type crystal vibrator wherein the electrode induced fields are supportive of mechanically induced fields for an overtone mode of vibration.

Still other objects and advantages of this invention will in part by obvious and will in part be apparent from the specification.

The invention accordingly comprises the features of construction, combination of element, arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
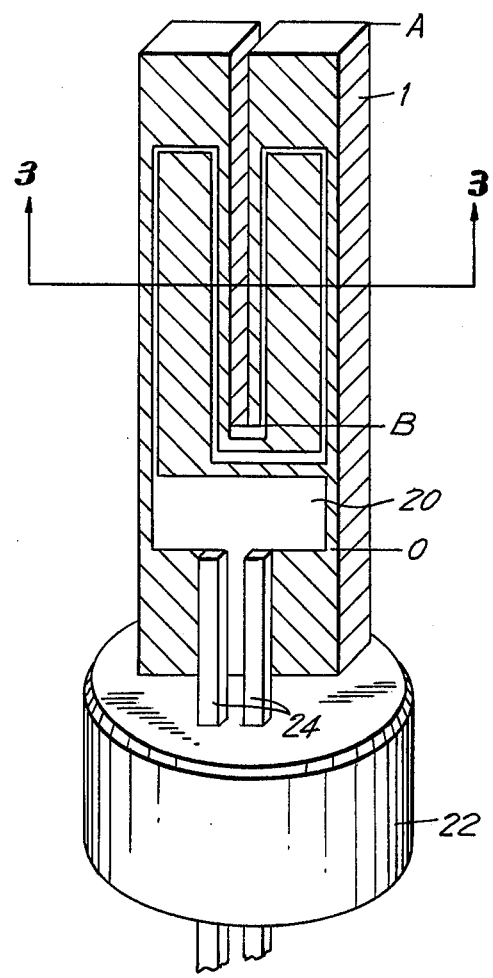
FIG. 1 is a tuning fork type quartz crystal vibrator having an electrode structure suitable for exciting a fundamental flexural vibration coupled to a fundamental torsional vibration.

FIG. 1 illustrates an embodiment of an electrode structure on a tuning fork type quartz crystal vibrator.

This electrode structure is used for exciting a first overtone of flexural vibration which is coupled to a torsional vibration. The electrode 1, shown shaded with oblique lines, is formed on a tuning fork vibrator leaf 20 and mounted to a base 22 by posts 24. Such an electrode structure was originally used for exciting a fundamental vibration in flexure of the tuning fork vibrator, but it is also possible to excite a first overtone of flexural vibration.

Figure 7:
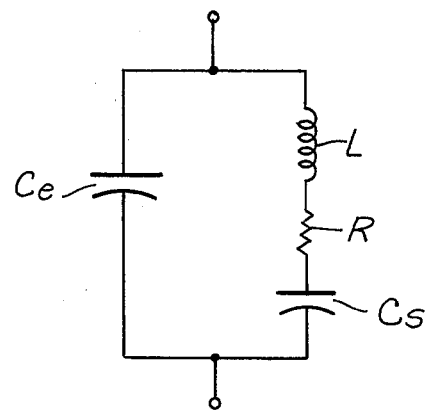
FIG. 7 is an equivalent circuit for a tuning fork crystal vibrator.

However, when the first overtone is excited by electrodes of such a structure, there are disadvantages in that the equivalent resonant resistance R of oscillation, as represented in an equivalent circuit of a tuning fork, crystal vibrator (FIG. 7), increases and the capacity ratio decreases. The ratio of the electrostatic capacity Ce to the equivalent series capacity Cs defines the capacity ratio. When the equivalent resonant resistance R becomes large, the power consumption required to induce and maintain oscillation increases. Also, if the capacity ratio is small, the adjustment range for the oscillation frequency of the vibrator is limited. These are substantial disadvantages when a mode coupled quartz tuning fork is applied to an electronic timepiece where power availability is limited and accuracy of performance is required.

An object of this invention is to provide an electrode structure for a tuning fork type quartz crystal vibrator which eliminates these disadvantages. To better understand the reason for these disadvantages in the vibrator having the electrode pattern of FIG. 1, the cutting angle $\psi$ of a mode coupled quartz tuning fork, the distribution of the exciting electric fields in the tuning fork arms, the distribution of displacements of the tuning fork arms, and the distribution of strain in the vibrator need to be examined as follows.

Figure 2:
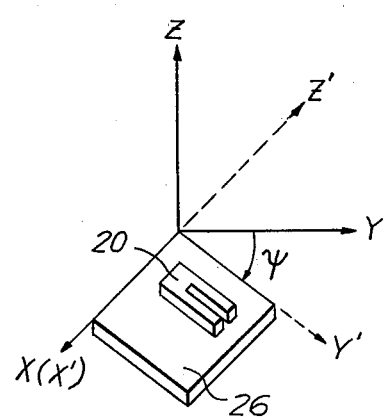
FIG. 2 indicates the angles for cutting a tuning fork type quartz crystal vibrator in accordance with this invention from a crystal plate.

FIG. 2 shows in the angle $\psi$ for cutting a quartz crystal plate 26 away from a quartz crystal. The X axis, Y axis and Z axis respectively are the electrical axis, mechanical axis and optical axis of the quartz crystal. The vibrator 20 is cut from a quartz plate 26 which has been rotated around the X axis in a range of 0 degrees to $-15$ degrees indicated as the angle $\psi$. In this condition the tuning fork arms of the vibrator are directed in the direction indicated as Y'.

Figure 3:
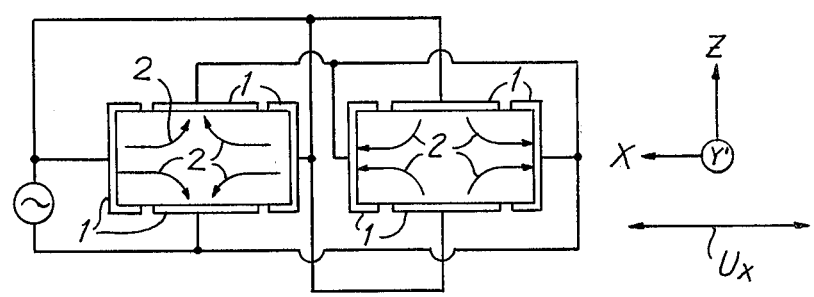
FIG. 3 is a sectional view taken along the line 3—3 of FIG. 1 and showing electrically induced fields.

FIG. 3 shows exciting electric fields indicated by arrows 2 at a transverse section of the tuning fork arms.

Figure 4:
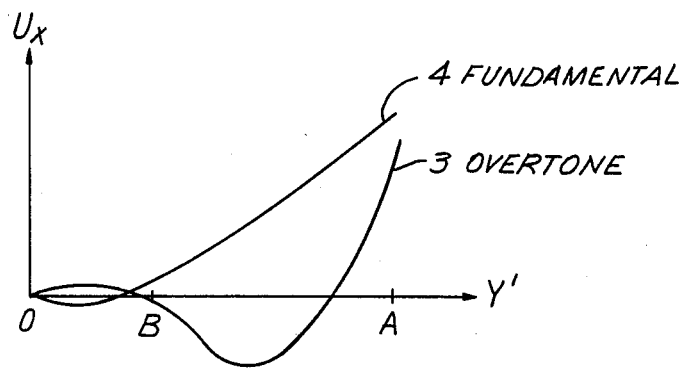
FIG. 4 is a chart of flexural displacements in an arm of a tuning fork of FIG. 1.

FIG. 4 shows a distribution of displacement Ux of the flexural mode of vibration of a tuning fork arm in the direction parellel to the X axis (FIG. 3). The abscissa indicates each incremental distance along the length of the tuning fork arm in the Y' direction where (FIG. 1) 0 indicates the ends of the supporting posts 24. A indicates the far, free end of the tuning fork arm, and B indicates an arm root or base. The curve identified by reference numeral 3 shows displacement of the first overtone frequency and reference numeral 4 identifies a distribution of a displacement of the fundamental frequency. In this case, as the displacement components of the torsional vibration are minor, only components of flexural vibration are illustrated. The displacements in both arms are similar, but out of phase.

Figure 5:
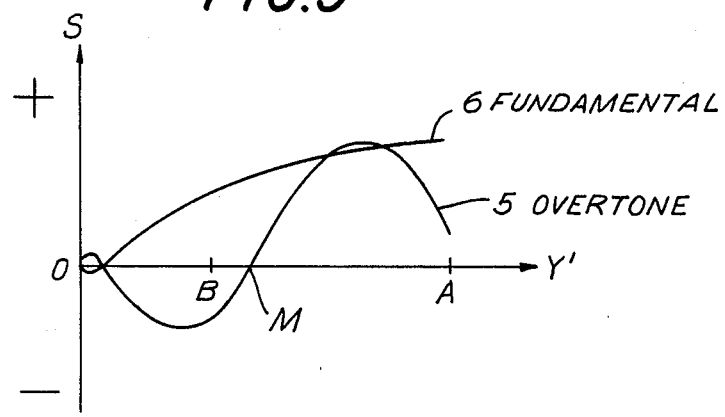
FIG. 5 is a graph of the strains in the arm of the tuning fork crystal vibrator corresponding to the displacements of FIG. 4.

FIG. 5 shows a distribution of strain S induced by the flexural vibration in the tuning fork arm. This strain S is both an expansive and a contractive strain in the direction of Y', and is mathematically equal to the product of $d^2Ux/dY'^2$ and the distance from the neutral plane in the tuning fork arm. The abscissa (FIG. 5) indicates incremental distances of the tuning fork arm in the same manner as in FIG. 4. The ordinate indicates strain S. The curve identified by reference numeral 5 shows a distribution of strain caused by the first overtone of vibration. The curve 6 indicates a distribution of strain caused by a fundamental vibration. This strain S is defined mathematically as follows using the piezoelectric strain coefficient, where the component of externally applied electric field in the X-axis direction is defined as Ex.

$$S \approx -d_{11}Ex \tag{1}$$

In this expression, $-d_{11}$ is positive. From this equation, it is determined with reference to FIG. 3, that S is negative, that is a contraction, in the right half portion of the right tuning fork arm. S is positive, that is, an expansion, at the left half portion. S is positive, that is, an expansion, at the right half of the left tuning fork arm. S is negative, that is, a contraction, in the left half of the left tuning fork arm. Thus, the flexural vibration is generated by these distortions with each arm moving instantaneously in the opposite direction from the other arm.

As shown in FIG. 5, the mathematical sign of the distribution 6 of strain caused by the fundamental vibration does not change over almost the entire length in the Y' direction of the tuning fork arm, and a fundamental vibration is readily excited by such an electrode as shown in FIG. 1. In other words, because the components of electric field in the X-axis direction occuring in the tuning fork arm (FIG. 1) are acting in the same direction substantially from the free end A of the tuning fork arm to the root B, the mathematical sign of strain S is not changed over that distance. As a result, the entire arm tends to displace simultaneously in the same direction, i.e., a fundamental vibration.

However, it is considerably more difficult to excite a first overtone of vibration by such an electrode pattern as shown in FIG. 1, because the mathematical sign of the distribution of strain S caused by the first overtone changes approximately half way along the length of the tuning fork arm as shown by curve 5 in FIG. 5 at the position M. Accordingly, the first overtone is not easily excited by such an electrode as shown in FIG. 1, wherein the mathematical sign of strain induced by the electric fields does not change anywhere along the arms length from the free end A to the root B. As a result, the electric field, externally applied, is not applied effectively by electrodes as patterned in FIG. 1 for exciting the overtone because portions of the field oppose the actual physical deformations. Thus, the equivalent resonant resistance R (FIG. 7) of the overtone vibration is high as compared to the fundamental resonant resistance.

Next, the electric charge occurring in such electrodes as shown in FIG. 1 is considered. The polarization Px in the X-axis direction produced at the lateral face of a tuning fork arm is defined as follows:

$$Px \approx d_{11}S \tag{2}$$

The charge produced at the lateral faces of the tuning fork arm is defined by the scaler product of a polarization vector and a normal vector which is vertical to the face. For example, in FIG. 3, a negative charge is produced at the right half of the right tuning fork arm, a negative charge is produced in the left half of the right tuning fork arm, a positive charge is produced in the right half of the left tuning fork arm, and a positive charge is produced in the left half of the left tuning fork arm.

As the mathematical sign of the strain distribution 6 of the fundamental vibration is not changed over almost the entire length of the tuning fork arm, an electric charge is effectively produced in such an electrode as shown in FIG. 1. The greater is the quantity of the charge produced in the electrode, the larger is the capacity ratio, where the capacity ratio, as above, is the ratio of the electrostatic capacity Ce to the capacitance Cs of the LRC branch of the equivalent circuit of FIG. 7. Accordingly, an electrode pattern as shown in FIG. 1, is most suited for exciting the fundamental vibration rather than an overtone vibration.

However, it should be noted that the mathematical sign of the distribution 5 of strain (FIG. 5) of the first overtone is changed along the length of the tuning fork arm, and the adjacent signs of the charges produced by these strains are opposed to each other, with the regions of opposite charges being bounded by the positions where the mathematical sign of the strain curve changes. As a result, the quantity of the charge produced in the electrode is decreased and the capacity ratio decreases when an overtone is produced by the electrode pattern of FIG. 1, which has the same polarity of field along the entire arm length.

An object of this invention is to provide an electrode structure by which a small equivalent resonant resistance R and a large capacity ratio are achieved in a mode coupled quartz tuning fork wherein the first overtone of the flexural vibration and the torsional vibration are used for coupling, that is, the two frequencies are close together as discussed in the pending U.S. application cited above.

Figure 6C:
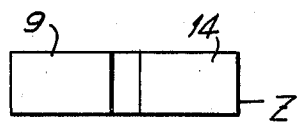
FIGS. 6(a), 6(b) and 6(c) are the front, back and top views respectively of a tuning fork type quartz crystal vibrator having an electrode pattern in accordance with this invention.
Figure 6A:
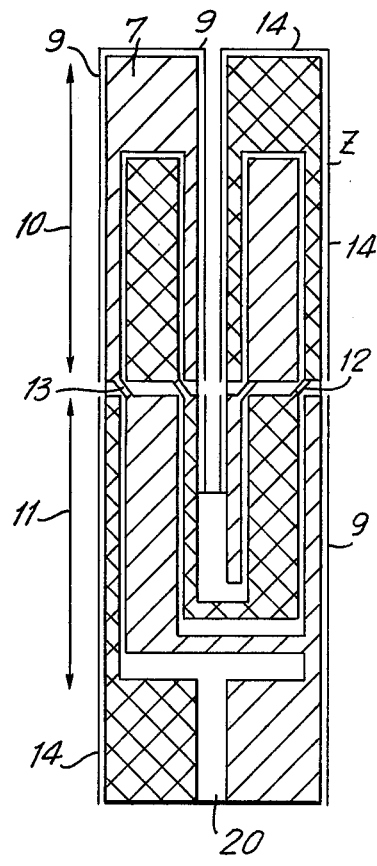

FIGS. 6(a), (b), (c) illustrate an embodiment of an electrode structure in accordance with this invention. Reference numerals 7 and 8 indicate two face electrodes on the surfaces of the arms. For clarity in illustration electrode 7 is shaded with oblique lines and electrode 8 is shaded with crosshatching. Each electrode extends over portions of both front and back surfaces, being joined by the lateral edges 9, 14 and the narrow bridge segments 12, 13 on the faces. Reference numeral 9 indicates side electrodes disposed on lateral faces which are electrically connected to the portions 7. The shapes of the electrodes 7 and 8 are different from each other. Note that portions identified with reference numerals 7, 9, 13 form one electrically continuous electrode and reference numerals 8, 12, 14 form the other electrically continuous electrode. Further, the portions 7 on one face are substantially opposed by a similarly shaped portion 7 on the opposite face. The portions 8 on one face are substantially opposed by similarly shaped portions 8 on the opposite face.

Figure 6B:
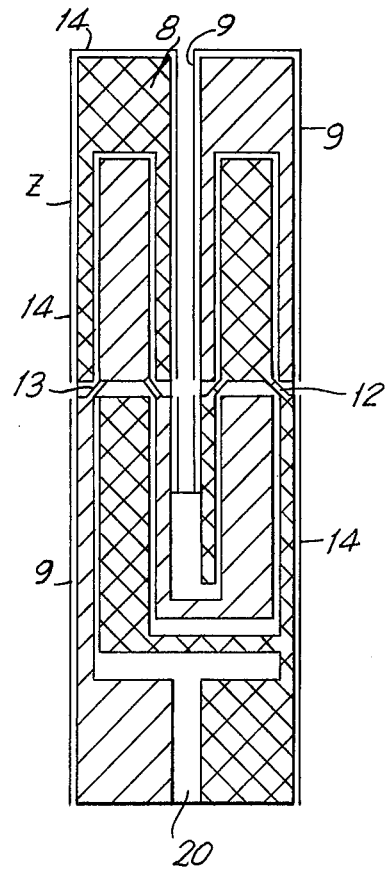

When such an electrode pattern as shown in FIG. 6 is used, the direction of the electric field produced in the upper half 10 of the tuning fork, and the direction of the electric field produced in the lower half 11 of the tuning fork are opposed to each other. The mathematical sign of the strain produced in each portion 10, 11 is reversed from the other. Accordingly, when a first overtone, which has a strain characteristic 5 which reverses (FIG. 5), is excited by this electrode pattern, the exciting electric field is used efficiently and the equivalent resonant resistance R of the tuning fork crystal (FIG. 7) decreases. As a result, oscillations in the overtone mode are easily produced.

Further, the polarity of charge produced at the upper half 10 of the tuning fork leaf 20, and the polarity of the charge produced at the lower half of the tuning fork leaf 20 are reversed with each other, as the side electrodes are also separated at the boundary of the upper half 10 and the lower half 11 of the tuning fork. Accordingly, the produced charges do not interfere with each other so as to reduce the overall effect, and as a result, the capacity ratio is increased.

When such an electrode pattern as shown in FIG. 6 is applied to a mode-coupled quartz tuning fork, wherein the first overtone of flexural vibration and the torsional vibration fundamental are excited, the equivalent resonant resistance R is decreased, and the capacity ratio is increased as compared to the excitation of the same vibration modes using an electrode pattern in accordance with FIG. 1. By comparison, the electrode pattern shown in FIGS. 6 has an equivalent resonant resistance R of about one half of the equivalent resonant resistance of the electrode pattern of FIG. 1. The capacity ratio for the electrode pattern of FIG. 6 is about five times the capacity ratio resulting from an electrode pattern as shown in FIG. 1. Thus, these parameters are greatly improved and energy consumption is low because of the low resonant resistance. A good range of adjustability is provided because of the high capacity ratio.

Moreover, the electrode structure for efficiently exciting an overtone higher than the second overtone can be made by using substantially the same concept as already described in relation to the first overtone. More particularly, to readily excite the nth overtone, the electrode is divided n times along the length of the tuning fork arm. The locations of the electrode divisions are established where the mathematical sign of the strain S reverses and may be determined by using a displacement curve as discussed above. Also, when exciting the nth overtone, a division of an electrode into less than n portions may suffice. This is a satisfactory electrode pattern when the magnitude of electric field used for exciting the nth overtone is greater in magnitude than any components of electric field which are opposed to or not used for such excitation. Therefore, it is possible, for example, to excite the nth overtone efficiently by only one division of the electrode pattern along the length of the tuning fork arm.

An electrode pattern in accordance with this invention can be readily made by photo-lithographic techniques. Although the flexural mode of vibration has been considered as the primary or main vibrational mode in the discussion above, it should be understood that an overtone of torsional vibration can be applied as the main vibration when it is coupled, has a favorable temperature-resonant frequency characteristic, and oscillates readily. If the electrode pattern is divided along the length of the arm where the mathematical sign of strain S changes, an nth overtone can be efficiently excited in the torsional mode.

As stated above, when a mode coupled quartz tuning fork vibrator is formed with an electrode pattern in accordance with this invention and is applied to an electronic timepiece, the equivalent resonant resistance is decreased in comparison with the conventional tuning fork vibrator. Accordingly, power consumption is reduced, and the capacity ratio increases so that the resonant frequency can be adjusted over a relatively wide range. Thus, an electronic timepiece with high accuracy and long life can be realized by applying the mode coupled quartz tuning fork vibrator having an electrode pattern in accordance with this invention and operating at an overtone frequency.

However, it should be realized that the divided electrode pattern in accordance with this invention is effective not only for mode coupled quartz crystal tuning fork vibrators, but also for any tuning fork type quartz crystal vibrator which operates in an overtone mode of flexural or torsional vibration.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interrupted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed:

1. A tuning fork type vibrator comprising:
a vibrator leaf having a base and a pair of arms extended therefrom to form a tuning fork;
at least a first electrode and a second electrode formed on portions of the surfaces of said vibrator leaf, said electrodes being electrically separate, said electrodes on the surfaces of said arms being divided by a gap at at least one position transversely across the length of said arms, edges of said first electrode on the face surfaces of said arms being substantially adjacent and opposed to edges on said arm face surfaces of said second electrode, each said electrode on a face of an arm covering a center portion of said arm face surface on one side of said gap and at least an edge portion on the other side of said gap, said portions of the same electrode being connected across said gap by a narrow bridge segment, when electrically driven, the electric fields of adjacent portions of said first and second electrodes across said gap are out of phase with each other.

2. A tuning fork type vibrator as claimed in claim 1, wherein said electrodes are substantially entirely separated longitudinally at said at least one transverse position, overtone vibrations being facilitated by said change in phase at said gap.

3. A tuning fork type vibrator as claimed in claim 2, wherein said at least first and said second electrodes are formed on the front face, back face, lateral surfaces and free end surfaces of said tuning fork arms.

4. A tuning fork type vibrator as claimed in claim 3, wherein every face on said tuning fork arms includes laterally adjacent portions of said first and second electrodes, every said face having a portion of said first and second electrodes on both sides of said transverse separation.

5. A tuning fork type vibrator as claimed in claim 4, wherein each portion of said first electrode on said front face is opposed by a similarly configured portion of said first electrode on said back face, and each portion of said second electrode on said front face is opposed by a similarly configured portion of said second electrode on said back face.

6. A tuning fork type vibrator as claimed in claim 5, wherein the electrode portions on said lateral and free end surfaces of said tuning fork arms extend continuously on to said front and back faces.

7. A tuning fork type vibrator as claimed in claim 1, 2, or 6, wherein said transverse division in said arms is located at the position where the strain, induced in said tuning fork arms by excitation of said electrodes with an AC field, changes sign.

8. A tuning fork type vibrator as claimed in claim 7, wherein said vibrator leaf is a quartz crystal.

9. A tuning fork type vibrator as claimed in claim 8, wherein said quartz crystal vibrator is mode coupled in at least two modes of vibration.

10. A tuning fork type vibrator as claimed in claim 9, wherein a main mode of vibration is a flexural overtone which is coupled to a fundamental torsional vibrational mode.

11. A tuning fork type vibrator as claimed in claim 1 or 6, wherein the number of said positions where said electrodes are divided by gaps transversely across said length of said arms is n, excitation of an nth overtone frequency of vibration being facilitated by electric fields of opposite phase induced across said gaps.

12. A tuning fork type vibrator as claimed in claim 1 or 6 wherein said electrodes are the product of a photolithographic technique.

* * * * *